(12) United States Patent
Lei et al.

(10) Patent No.: US 8,703,581 B2
(45) Date of Patent: Apr. 22, 2014

(54) WATER SOLUBLE MASK FOR SUBSTRATE DICING BY LASER AND PLASMA ETCH

(75) Inventors: Wei-Sheng Lei, San Jose, CA (US); Saravjeet Singh, Santa Clara, CA (US); Madhava Rao Yalamanchili, Morgan Hill, CA (US); Brad Eaton, Menlo Park, CA (US); Ajay Kumar, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 248 days.

(21) Appl. No.: 13/160,891

(22) Filed: Jun. 15, 2011

(65) Prior Publication Data

US 2012/0322233 A1 Dec. 20, 2012

(51) Int. Cl.
*H01L 21/00* (2006.01)

(52) U.S. Cl.
USPC .......................................... 438/462; 438/463

(58) Field of Classification Search
USPC ................................. 438/460–464
See application file for complete search history.

(56) References Cited

U.S. PATENT DOCUMENTS

| | | | |
|---|---|---|---|
| 4,049,944 A | 9/1977 | Garvin et al. | |
| 4,339,528 A | 7/1982 | Goldman | |
| 4,684,437 A | 8/1987 | Donelon et al. | |
| 5,336,638 A * | 8/1994 | Suzuki et al. | 438/240 |
| 5,593,606 A | 1/1997 | Owen et al. | |
| 5,632,667 A * | 5/1997 | Earl et al. | 451/41 |
| 5,691,794 A | 11/1997 | Hoshi et al. | |
| 6,051,503 A | 4/2000 | Bhardwaj et al. | |
| 6,057,180 A | 5/2000 | Sun et al. | |
| 6,117,347 A | 9/2000 | Ishida | |
| 6,174,271 B1 | 1/2001 | Kosmowski | |
| 6,300,593 B1 | 10/2001 | Powell | |
| 6,306,731 B1 | 10/2001 | Igarashi et al. | |
| 6,407,363 B2 | 6/2002 | Dunsky et al. | |
| 6,426,275 B1 | 7/2002 | Arisa | |
| 6,465,158 B1 | 10/2002 | Sekiya | |
| 6,528,864 B1 | 3/2003 | Arai | |
| 6,574,250 B2 | 6/2003 | Sun et al. | |
| 6,582,983 B1 | 6/2003 | Runyon et al. | |
| 6,593,542 B2 | 7/2003 | Baird et al. | |

(Continued)

FOREIGN PATENT DOCUMENTS

| | | |
|---|---|---|
| JP | 9216085 | 8/1997 |
| JP | 10321908 | 12/1998 |

(Continued)

OTHER PUBLICATIONS

Linder, et al., "Water-Soluble Sacrificial Layers for Surface Micromachining", www.small-journal.com, 2005, 1, No. 7, 7 Pages.
Singh, et al., "Apparatus and Methods for Dry Etch With Edge, Side and Back Protection", U.S. Appl. No. 61/491,693, filed May 31, 2011 24 pgs.
Restriction Requirement for U.S. Appl. No. 13/180,336 dated Sep. 11, 2012, 6 pages.
International Search Report and Written Opinion from PCT/US2012/040303 mailed Dec. 28, 2012, 9 pgs.

(Continued)

*Primary Examiner* — Richard Booth
(74) *Attorney, Agent, or Firm* — Blakely, Sokoloff, Taylor & Zafman LLP

(57) ABSTRACT

Methods of dicing substrates having a plurality of ICs. A method includes forming a mask comprising a water soluble material layer over the semiconductor substrate. The mask is patterned with a femtosecond laser scribing process to provide a patterned mask with gaps. The patterning exposes regions of the substrate between the ICs. The substrate is then etched through the gaps in the patterned mask to singulate the IC and the water soluble material layer washed off.

14 Claims, 10 Drawing Sheets

(56) References Cited

U.S. PATENT DOCUMENTS

| | | |
|---|---|---|
| 6,642,127 B2 | 11/2003 | Kumar et al. |
| 6,676,878 B2 | 1/2004 | O'Brien et al. |
| 6,696,669 B2 | 2/2004 | Hembree et al. |
| 6,706,998 B2 | 3/2004 | Cutler |
| 6,759,275 B1 | 7/2004 | Lee et al. |
| 6,803,247 B2 | 10/2004 | Sekiya |
| 6,887,804 B2 | 5/2005 | Sun et al. |
| 6,998,571 B2 | 2/2006 | Sekiya et al. |
| 7,128,806 B2 | 10/2006 | Nguyen et al. |
| 7,129,150 B2 | 10/2006 | Kawai |
| 7,179,723 B2 | 2/2007 | Genda et al. |
| 7,265,033 B2 | 9/2007 | Shigematsu et al. |
| 7,361,990 B2 | 4/2008 | Lu et al. |
| 7,364,986 B2 | 4/2008 | Nagai et al. |
| 7,435,607 B2 | 10/2008 | Nagai |
| 7,459,377 B2 | 12/2008 | Ueda et al. |
| 7,468,309 B2 | 12/2008 | Shigematsu et al. |
| 7,473,866 B2 | 1/2009 | Morishige et al. |
| 7,507,638 B2 | 3/2009 | Mancini et al. |
| 7,507,639 B2 | 3/2009 | Nakamura |
| 7,629,228 B2 | 12/2009 | Haji et al. |
| 7,678,670 B2 | 3/2010 | Arita et al. |
| 7,687,740 B2 | 3/2010 | Bruland et al. |
| 7,754,584 B2 | 7/2010 | Kumakawa |
| 7,767,551 B2 | 8/2010 | Arita et al. |
| 7,767,554 B2 | 8/2010 | Arita et al. |
| 7,776,720 B2 | 8/2010 | Boyle et al. |
| 7,804,043 B2 * | 9/2010 | Deshi .................. 219/121.67 |
| 7,838,323 B2 | 11/2010 | Utsumi et al. |
| 7,859,084 B2 | 12/2010 | Utsumi et al. |
| 7,875,898 B2 | 1/2011 | Maeda |
| 7,906,410 B2 * | 3/2011 | Arita et al. ................ 438/462 |
| 7,923,351 B2 | 4/2011 | Arita |
| 7,926,410 B2 | 4/2011 | Bair |
| 7,927,973 B2 | 4/2011 | Haji et al. |
| 2001/0035401 A1 | 11/2001 | Manor |
| 2002/0012345 A1 | 1/2002 | Kalkunte et al. |
| 2002/0042189 A1 | 4/2002 | Tanaka |
| 2002/0148807 A1 * | 10/2002 | Zhao et al. .................. 216/2 |
| 2003/0045101 A1 | 3/2003 | Flanner et al. |
| 2003/0152756 A1 | 8/2003 | Yamada et al. |
| 2003/0162313 A1 | 8/2003 | Kim et al. |
| 2004/0080045 A1 | 4/2004 | Kimura et al. |
| 2004/0137700 A1 | 7/2004 | Sekiya |
| 2004/0157457 A1 | 8/2004 | Xu et al. |
| 2004/0212047 A1 | 10/2004 | Joshi et al. |
| 2004/0259329 A1 | 12/2004 | Boyle et al. |
| 2006/0024924 A1 | 2/2006 | Haji et al. |
| 2006/0043535 A1 | 3/2006 | Hiatt |
| 2006/0086898 A1 | 4/2006 | Cheng et al. |
| 2006/0088984 A1 | 4/2006 | Li et al. |
| 2006/0146910 A1 | 7/2006 | Koochesfahani et al. |
| 2006/0205182 A1 | 9/2006 | Soejima |
| 2007/0272555 A1 | 11/2007 | Baird |
| 2007/0272666 A1 | 11/2007 | O'Brien et al. |
| 2008/0283848 A1 | 11/2008 | Yamazaki |
| 2009/0176375 A1 | 7/2009 | Benson et al. |
| 2009/0255911 A1 | 10/2009 | Krishnaswami et al. |
| 2009/0321748 A1 | 12/2009 | Lee |
| 2010/0013036 A1 | 1/2010 | Carey |
| 2010/0025387 A1 | 2/2010 | Arai et al. |
| 2010/0048001 A1 | 2/2010 | Harikai et al. |
| 2010/0120227 A1 | 5/2010 | Grivna et al. |
| 2010/0120230 A1 | 5/2010 | Grivna et al. |
| 2010/0246611 A1 | 9/2010 | Sun |
| 2010/0248451 A1 | 9/2010 | Pirogovsky et al. |
| 2011/0029124 A1 | 2/2011 | Boyle et al. |
| 2013/0045554 A1 | 2/2013 | Yamazaki |
| 2013/0065378 A1 | 3/2013 | Johnson et al. |
| 2013/0230972 A1 | 9/2013 | Johnson et al. |

FOREIGN PATENT DOCUMENTS

| | | |
|---|---|---|
| JP | 2001127011 | 5/2001 |
| JP | 2001144126 | 5/2001 |
| JP | 2003179005 | 6/2003 |
| JP | 2004031526 | 1/2004 |
| JP | 2004055684 | 2/2004 |
| JP | 2007281526 | 10/2007 |
| JP | 2009034694 | 2/2009 |
| JP | 2010165963 | 7/2010 |
| KR | 20100020727 | 2/2010 |
| WO | WO-03036712 | 5/2003 |
| WO | WO-03071591 | 5/2003 |
| WO | WO-2011163149 | 12/2011 |
| WO | WO-2012173758 | 12/2012 |
| WO | WO-2012173759 | 12/2012 |
| WO | WO-2012173768 | 12/2012 |
| WO | WO-2012173770 | 12/2012 |

OTHER PUBLICATIONS

Restriction Requirement for U.S. Appl. No. 13/161,006 Mailed Jan. 10, 2013, 6 Pages.

International Search Report and Written Opinion for PCT Patent Application No. PCT/US2012/040295 Mailed Dec. 27, 2012, 11 Pages.

Restriction Requirement for U.S. Appl. No. 13/161,026 Mailed Jan. 17, 2013, 6 Pages.

International Search Report and Written Opinion from PCT/US2012/040307 mailed Dec. 28, 2012, 9 pgs.

International Search Report and Written Opinion for PCT Patent Application No. PCT/US2012/039746 Mailed Dec. 26, 2012, 10 Pages.

Restriction Requirement for U.S. Appl. No. 13/161,036 Mailed Feb. 1, 2013, 6 Pages.

Restriction Requirement for U.S. Appl. No. 13/160,973 Mailed Jan. 9, 2013, 6 Pages.

International Search Report and Written Opinion for PCT Patent Application No. PCT/US2012/039207 Mailed Dec. 26, 2012, 12 Pages.

International Search Report and Written Opinion for PCT Patent Application No. PCT/US2012/039209 Mailed Dec. 26, 2012, 8 Pages.

International Search Report and Written Opinion for PCT Patent Application No. PCT/US2012/039205 Mailed Dec. 26, 2012, 11 Pages.

International Search Report and Written Opinion for PCT Patent Application No. PCT/US2012/039753 Mailed Dec. 26, 2012, 9 Pages.

International Search Report and Written Opinion for PCT Patent Application No. PCT/US2012/040289 Mailed Jan. 2, 2013, 11 Pages.

International Search Report and Written Opinion for PCT Patent Application No. PCT/US2011/041126 Mailed Feb. 21, 2012, 10 Pages.

International Preliminary Report on Patentability for PCT Patent Application No. PCT/US2011/041126 Mailed Jan. 10, 2013, 7 Pages.

Restriction Requirement for U.S. Appl. No. 13/161,045 Mailed Feb. 19, 2013, 5 Pages.

Van Borkulo, Jeroen et al., "Enabling Technology in Thin Wafer Dicing", The Electrochemical Society, vol. 18, Issue 1, Packaging Technology, 2009, pp. 837-842.

Non-Final Office Action for U.S. Appl. No. 13/180,336 Mailed Feb. 6, 2013, 15 Pages.

Addae-Mensah et al., "Poly(vinyl alcohol) as a structure release layer for the microfabrication of polymer composite structures", IOP Publishing. Journal of Micromechanics and Microengineering, 17 (2007), pp. N41-N46.

* cited by examiner

WATER SOLUBLE MASK FOR SUBSTRATE DICING BY LASER AND PLASMA ETCH

TECHNICAL FIELD

Embodiments of the present invention pertain to the field of semiconductor processing and, in particular, to masking methods for dicing substrates, each substrate having an IC (IC) thereon.

BACKGROUND DESCRIPTION OF RELATED ART

In semiconductor substrate processing, ICs are formed on a substrate (also referred to as a wafer), typically composed of silicon or other semiconductor material. In general, thin film layers of various materials which are either semiconducting, conducting or insulating are utilized to form the ICs. These materials are doped, deposited and etched using various well-known processes to simultaneously form a plurality of ICs, such as memory devices, logic devices, photovoltaic devices, etc, in parallel on a same substrate.

Following device formation, the substrate is mounted on a supporting member such as an adhesive film stretched across a film frame and the substrate is "diced" to separate each individual device or "die" from one another for packaging, etc. Currently, the two most popular dicing techniques are scribing and sawing. For scribing, a diamond tipped scribe is moved across a substrate surface along pre-formed scribe lines. Upon the application of pressure, such as with a roller, the substrate separates along the scribe lines. For sawing, a diamond tipped saw cuts the substrate along the streets. For thin substrate singulation, such as 50-150 μms (μm) thick bulk silicon singulation, the conventional approaches have yielded only poor process quality. Some of the challenges that may be faced when singulating die from thin substrates may include microcrack formation or delamination between different layers, chipping of inorganic dielectric layers, retention of strict kerf width control, or precise ablation depth control.

While plasma dicing has also been contemplated, a standard lithography operation for patterning resist may render implementation cost prohibitive. Another limitation possibly hampering implementation of plasma dicing is that plasma processing of commonly encountered metals (e.g., copper) in dicing along streets can create production issues or throughput limits. Finally, masking of the plasma dicing process may be problematic, depending on, inter alia, the thickness and top surface topography of the substrate, the selectivity of the plasma etch, and the materials present on the top surface of the substrate.

SUMMARY

Embodiments of the present invention include methods of masking semiconductor substrates for a hybrid dicing process including both laser scribing and plasma etching.

In an embodiment, a method of dicing a semiconductor substrate having a plurality of ICs includes forming a mask over the semiconductor substrate, the mask including a water soluble material covering and protecting the ICs. The mask is patterned with a laser scribing process to provide a patterned mask with gaps, exposing regions of the substrate between the ICs. The substrate is then plasma etched through the gaps in the patterned mask to singulate the ICs into chips.

In another embodiment, a system for dicing a semiconductor substrate includes a femtosecond laser; a plasma etch chamber, and a wet station, coupled to a same platform.

In another embodiment, a method of dicing a substrate having a plurality of ICs includes forming a water soluble mask layer of a poly-vinyl alcohol (PVA) over a front side of a silicon substrate. The mask covers and protects ICs disposed on the front side of the substrate. The ICs include a copper bumped top surface having bumps surrounded by a passivation layer, such as polyimide (PI). Subsurface thin films below the bumps and passivation include a low-κ interlayer dielectric (ILD) layer and a layer of copper interconnect. The water soluble material, the passivation layer, and subsurface thin films are patterned with a femtosecond laser scribing process to expose regions of the silicon substrate between the ICs. The silicon substrate is etched through the gaps with a deep silicon plasma etch process to singulate the ICs and the PVA layer then washed off in water.

BRIEF DESCRIPTION OF THE DRAWINGS

Embodiments of the present invention are illustrated by way of example, and not limitation, in the figures of the accompanying drawings in which.

DETAILED DESCRIPTION

Figure 1:
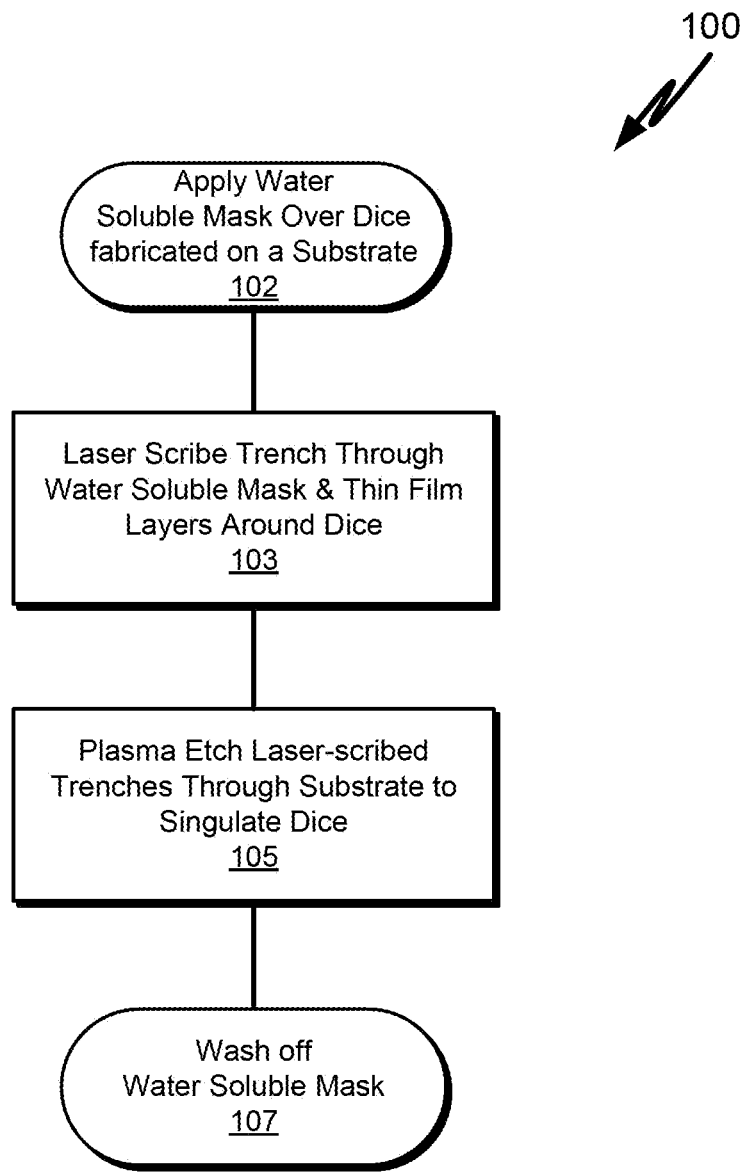
FIG. 1 is a flow diagram illustrating a hybrid laser ablation-plasma etch singulation method, in accordance with an embodiment of the present invention.

Methods of dicing substrates, each substrate having a plurality of ICs thereon, are described. In the following description, numerous specific details are set forth, such as femtosecond laser scribing and deep silicon plasma etching conditions in order to describe exemplary embodiments of the present invention. However, it will be apparent to one skilled in the art that embodiments of the present invention may be practiced without these specific details. In other instances, well-known aspects, such as IC fabrication, substrate thinning, taping, etc., are not described in detail to avoid unnecessarily obscuring embodiments of the present invention. Reference throughout this specification to "an embodiment" means that a particular feature, structure, material, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, materials, or characteristics may be combined in any suitable manner in one or more embodiments. Also, it is to be understood that the various exemplary embodiments shown in the Figures are merely illustrative representations and are not necessarily drawn to scale.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" my be used to indicate that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one material layer with respect to other material layers. As such, for example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in contact with that second layer. Additionally, the relative position of one layer with respect to other layers is provided assuming operations are performed relative to a substrate without consideration of the absolute orientation of the substrate.

Generally, a hybrid substrate or substrate dicing process involving an initial laser scribe and subsequent plasma etch is implemented with a water soluble mask for die singulation. The laser scribe process may be used to cleanly remove an unpatterned (i.e., blanket) mask layer, passivation layer, and subsurface thin film device layers. The laser etch process may then be terminated upon exposure of, or partial ablation of, the substrate. The plasma etch portion of the hybrid dicing process may then be employed to etch through the bulk of the substrate, such as through bulk single crystalline silicon, for singulation or dicing of chips.

In accordance with an embodiment of the present invention, a combination of femtosecond laser scribing and plasma etching is used to dice a semiconductor substrate into individualized or singulated ICs. In one embodiment, femtosecond laser scribing is an essentially, if not completely, non-equilibrium process. For example, the femtosecond-based laser scribing may be localized with a negligible thermal damage zone. In an embodiment, laser scribing is used to singulated ICs having ultra-low ICs films (i.e., with a dielectric constant below 3.0). In one embodiment, direct writing with laser eliminates a lithography patterning operation, allowing the masking material to be non-photosensitive, and a plasma etch-based dicing processing implemented with very little cost to partition the substrate. In one embodiment, through silicon via (TSV)-type etching is used to complete the dicing process in a plasma etch chamber.

FIG. 1 is a flow diagram illustrating a hybrid laser ablation-plasma etch singulation process 100, in accordance with an embodiment of the present invention. FIGS. 4A-4D illustrate cross-sectional views of a substrate 406 including first and second ICs 425, 426 corresponding to the operations in method 100, in accordance with an embodiment of the present invention.

Figure 4A:
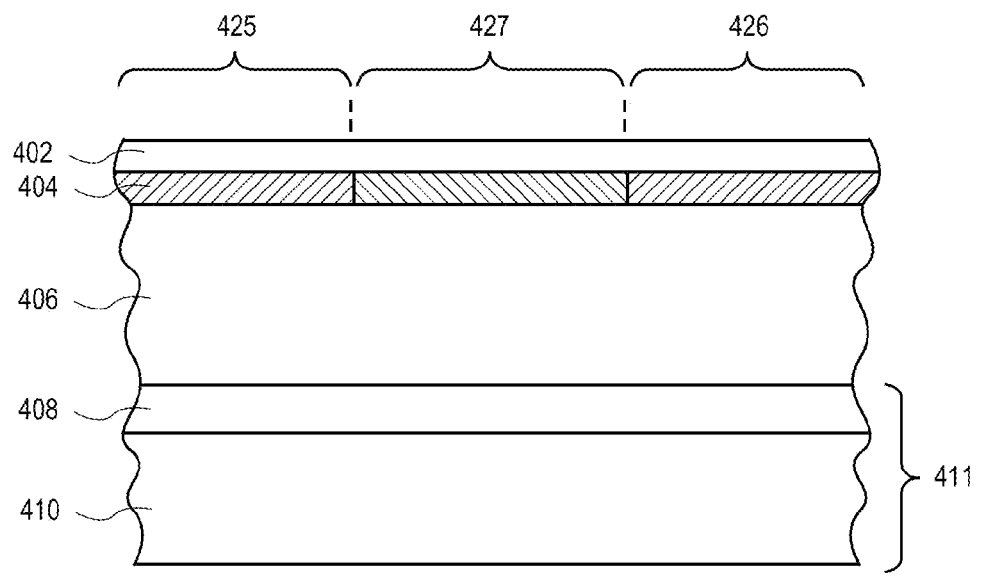
FIG. 4A illustrates a cross-sectional view of a semiconductor substrate including a plurality of ICs corresponding to operation 102 of the dicing method illustrated in FIG. 1, in accordance with an embodiment of the present invention.

Referring to operation 102 of FIG. 1, and corresponding FIG. 4A, a mask layer 402 is formed above a substrate 406. Generally, substrate 406 is composed of any material suitable to withstand a fabrication process of the thin film device layers formed thereon. For example, in one embodiment, substrate 406 is a group IV-based material such as, but not limited to, monocrystalline silicon, germanium or silicon/germanium. In another embodiment, substrate 406 is a III-V material such as, e.g., a III-V material substrate used in the fabrication of light emitting diodes (LEDs). During device fabrication, the substrate 406 is typically 600 µm-800 µm thick, but as illustrated in FIG. 4A has been thinned to 50 µm to 100 µm with the thinned substrate now supported by a carrier, such as a backing tape 410 stretched across a frame (not illustrate) and adhered to a backside of the substrate with a die attach film (DAF) 408.

In embodiments, first and second ICs 425, 426 include memory devices or complimentary metal-oxide-semiconductor (CMOS) transistors fabricated in a silicon substrate 406 and encased in a dielectric stack. A plurality of metal interconnects may be formed above the devices or transistors, and in surrounding dielectric layers, and may be used to electrically couple the devices or transistors to form the ICs 425, 426. Materials making up the street 427 may be similar to or the same as those materials used to form the ICs 425, 426. For example, street 427 may include thin film layers of dielectric materials, semiconductor materials, and metallization. In one embodiment, the street 427 includes a test device similar to the ICs 425, 426. The width of the street 427 may be anywhere between 10 µm and 100 µm.

In embodiments, the mask layer 402 includes a water soluble material layer covering a top surface of the ICs 425, 426. The mask layer 402 also covers intervening street 427 between the ICs 425, 426. The water soluble material layer is to provide protection a top surface of the ICs 425, 426 during the hybrid laser scribing, plasma etch dicing method 100 (FIG. 1). The mask layer 402 is unpatterned prior to the laser scribing operation 103 with the laser scribe to perform a direct writing of the scribe lines by ablating portions of the mask layer 402 disposed over the street 427.

Figure 5:
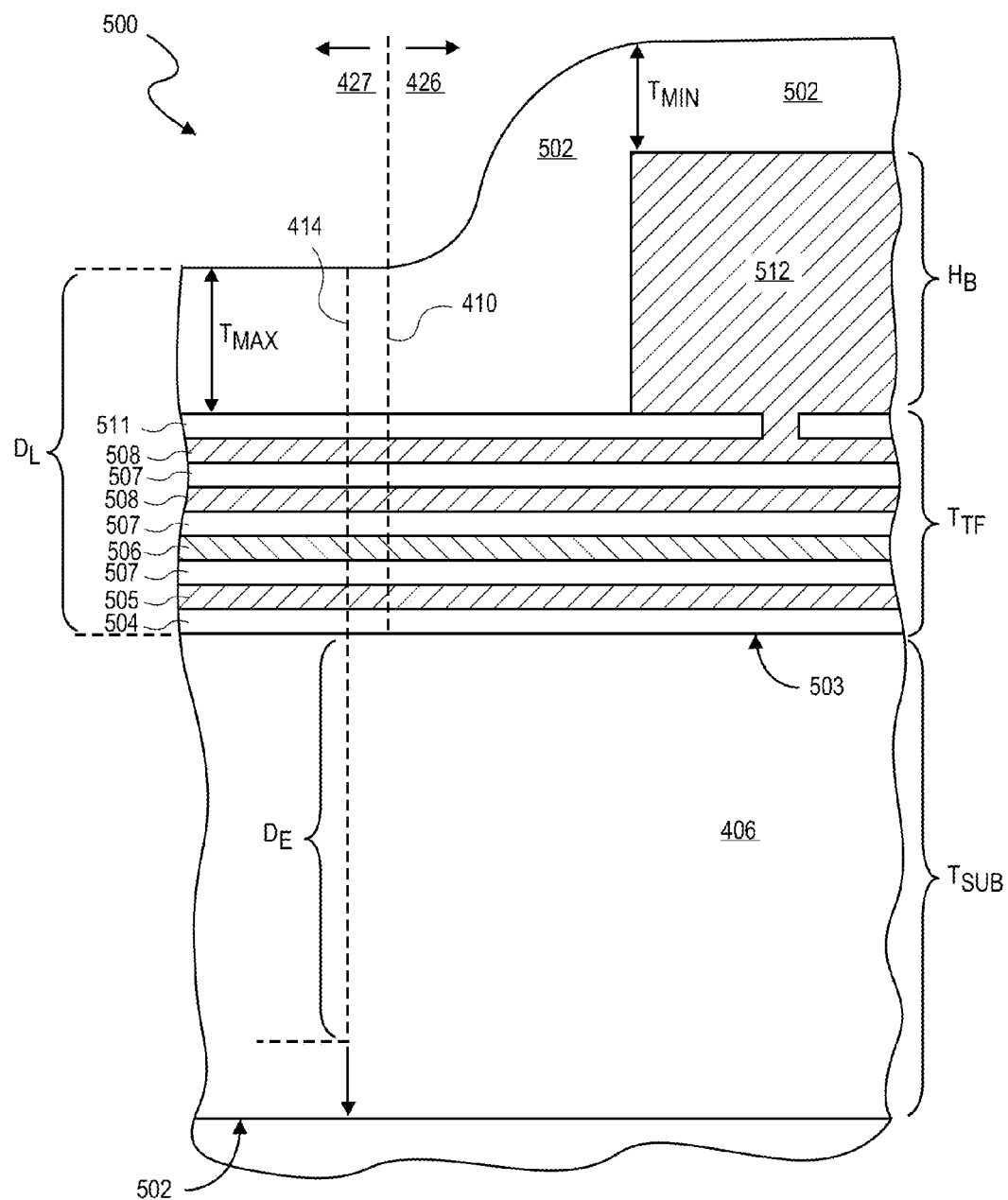
FIG. 5 illustrates a cross-sectional view of a water soluble mask applied to over a top surface and subsurface thin films of a substrate including a plurality of ICs, in accordance with embodiments of the present invention.

FIG. 5 illustrates an expanded cross-sectional view 500 of one exemplary embodiment including a water soluble layer 502 in contact with a top surface of the IC 426 and the street 427, in accordance with embodiments of the present invention. As shown in FIG. 5, the substrate 406 has a top surface 503 upon which thin film device layers are disposed which is opposite a bottom surface 501 which interfaces with the DAF 408(FIG. 4A). Generally, the thin film device layer materials may include, but are not limited to, organic materials (e.g., polymers), metals, or inorganic dielectrics such as silicon dioxide and silicon nitride. The exemplary thin film device layers illustrated in FIG. 5 include a silicon dioxide layer 504, a silicon nitride layer 505, copper interconnect layers 508 with low-κ (e.g., less than 3.5) or ultra low-κ (e.g., less than 3.0) interlayer dielectric layers (ILD) such as carbon doped oxide (CDO) disposed there between. A top surface of the IC 426 includes a bump 512, typically copper, surrounded by a passivation layer 511, typically a polyimide (PI) or similar polymer. The bumps 512 and passivation layer 511 therefore make up a top surface of the IC with the thin film device layers forming subsurface IC layers. The bump 512 extends from a top surface of the passivation layer 511 by a bump height $H_B$ which in the exemplary embodiments ranges between 10 μm and 50 μm.

In an embodiment, the water soluble layer 502 is the mask layer 402, such that the mask layer 402 includes no other material layers. Unlike other more conventional masking materials such as photoresist, inorganic dielectric hardmasks such as silicon dioxide, or silsesquioxanes, a mask including the water soluble layer 502 may be readily removed without damage to the underlying passivation layer 511 and/or bump 512. Where the water soluble layer 502 is the mask layer 402, the water soluble layer 502 is more than a mere contamination protection layer utilized during a conventional scribing process and is instead to provide protection during the subsequent plasma etching of the streets. As such, the water soluble layer 502 is to be of sufficient thickness to survive the plasma etch process, protecting even the bump 512 which, being copper, may be damaged, oxidized, or otherwise contaminated if exposed to the plasma. The minimum thickness of the water soluble layer 502 is a function of the selectivity achieved by the subsequent plasma etch (e.g., operation 105 in FIG. 1). The plasma etch selectivity is dependent on at least both the material/composition of the water soluble layer 502 and the etch process employed.

In an embodiment, the water soluble material comprises a water soluble polymer. Many such polymers are commercially available for applications such as laundry and shopping bags, embroidery, green packaging, etc. However, selection of water soluble material for the present invention is complicated by stringent demands on maximum film thickness, etch resistance, thermal stability, mechanics of applying and removing the material from the substrate, and microcontamination. In the street, the maximum thickness $T_{max}$ of the water soluble layer 502 is limited by the ability of a laser to pattern through the masking by ablation. The water soluble layer 502 may be much thicker over the ICs 425, 426 and or edges of the street 427 where no street pattern is to be formed. As such, $T_{max}$ is generally a function of the optical conversion efficiency associated with laser wavelength. As $T_{max}$ is associated with the street 427, street feature topography, street width, and the method of applying the water soluble layer 502 may be selected to achieve a desired $T_{max}$. In particular embodiments, the water soluble layer 502 has a thickness $T_{max}$ which is less than 30 μm and advantageously less than 20 μm with a thicker mask calling for multiple laser passes.

In an embodiment, the water soluble layer 502 is thermally stable to at least 60° C., preferably stable at 100° C., and ideally stable to 120° C. to avoid excessive crosslinking during the subsequent plasma etch process when the material's temperature will be elevated. Generally, excessive crosslinking adversely affects the solubility of the material, making post-etch removal more difficult. Depending on the embodiment, the water soluble layer 502 may be either wet applied onto the substrate 406 to cover the passivation layer 511 and bump 512 or applied as a dry film laminate. For either mode of application, exemplary materials include, at least one of: poly(vinyl alcohol), poly(acrylic acid), poly(methacrylic acid), poly(acrylamide), or poly(ethylene oxide) with many other water soluble materials also readily available, particularly as a dry film laminate. Dry films for lamination may include the water soluble material only or may further include an adhesive layer that may also be water soluble or not. In a particular embodiment, the dry film includes a UV sensitive adhesive layer which has reduced adhesive bond strength upon UV exposure. Such UV exposure may occur during the subsequent plasma street etch.

Experimentally, poly(vinyl alcohol) (PVA) has been found to provide an etch rate of between 1 μm/min and 1.5 μm/min for the exemplary silicon plasma etch processes described elsewhere herein for an etch rate selectivity of approximately 1:20 (PVA: silicon). The other exemplary materials may offer similar a etch performance. As such, the minimum thickness over a top bump surface of an IC (e.g., $T_{min}$ in FIG. 5) may be determined by the plasma etch depth $D_E$ which is both a function of the thickness of the substrate $T_{sub}$ and laser scribe depth $D_L$. In the exemplary embodiment where $D_E$ is at least 50 the water soluble layer 502 has a thickness of at least 5 μm and advantageously at least 10 μm to provide sufficient margin for $D_E$ of at least 100

Figure 2A:
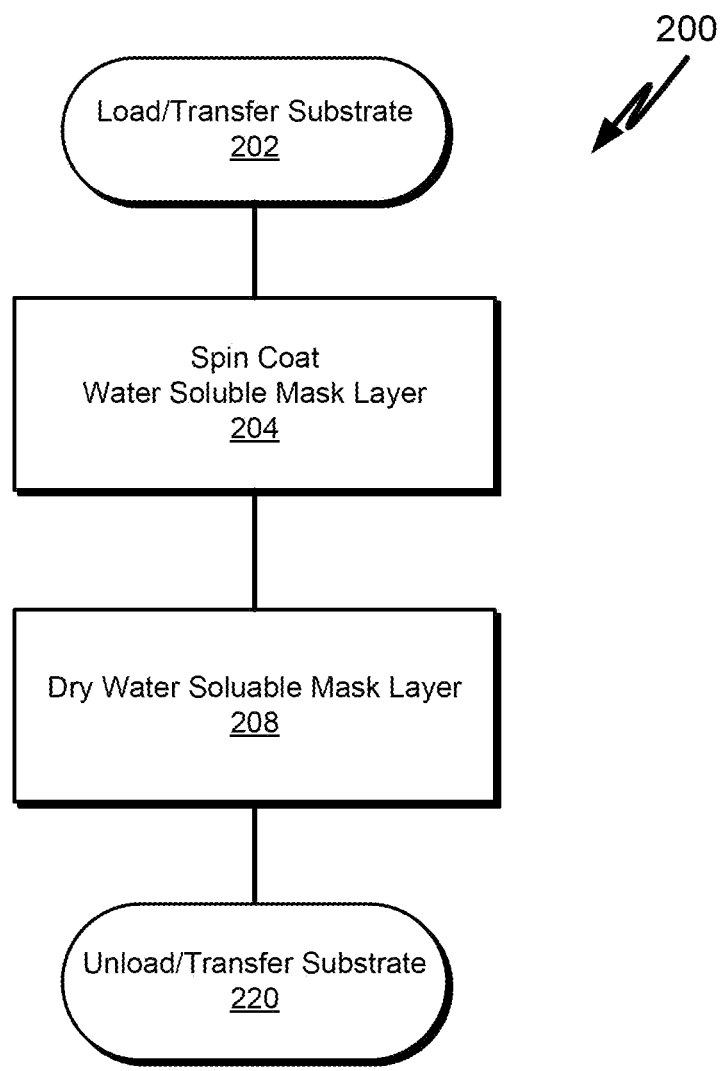
FIG. 2A is a flow diagram illustrating a method of spin coating water soluble mask layer onto a substrate to be diced, in accordance with an embodiment of the present invention.

With the water soluble layer 502 having a thickness $T_{max}$ which is less than 30 μm and a $T_{min}$ of 10 μm or more, application of the water soluble layer 502 to the substrate is more demanding than a spray application of a contamination preventative. FIG. 2A is a flow diagram illustrating a method 200 for spin coating water soluble mask layer onto a substrate to be diced, in accordance with an embodiment of the present invention. At operation 202, a substrate is loaded onto a spin coat system or transferred into a spin coat module of an integrated platform. At operation 204 an aqueous solution of a water soluble polymer is spun over the passivation layer 511 and bump 512. Experiments conducted with PVA solutions showed a non-planarized coverage of 50 μm bumps a $T_{min}$ greater than 5 μm and a $T_{max}$ at the street less than 20 μm.

At operation 208 the aqueous solution is dried, for example on a hot plate, and the substrate unloaded for laser scribe or transferred in-vaccuo to a laser scribe module. For particular embodiments where the water soluble layer 502 is hygroscopic, in-vaccuo transfer is particularly advantageous. The spin and dispense parameters are a matter of choice depending on the material, substrate topography and desired layer thickness. The drying temperature and time should be selected to provide adequate etch resistance while avoiding excessive crosslinking which renders removal difficult. Exemplary drying temperatures range from 60° C. to 150° C. depending on the material. For example, PVA was found to remain soluble at 60° C. while becoming more insoluble as the temperature approached the 150° C. limit of the range.

Figure 2B:
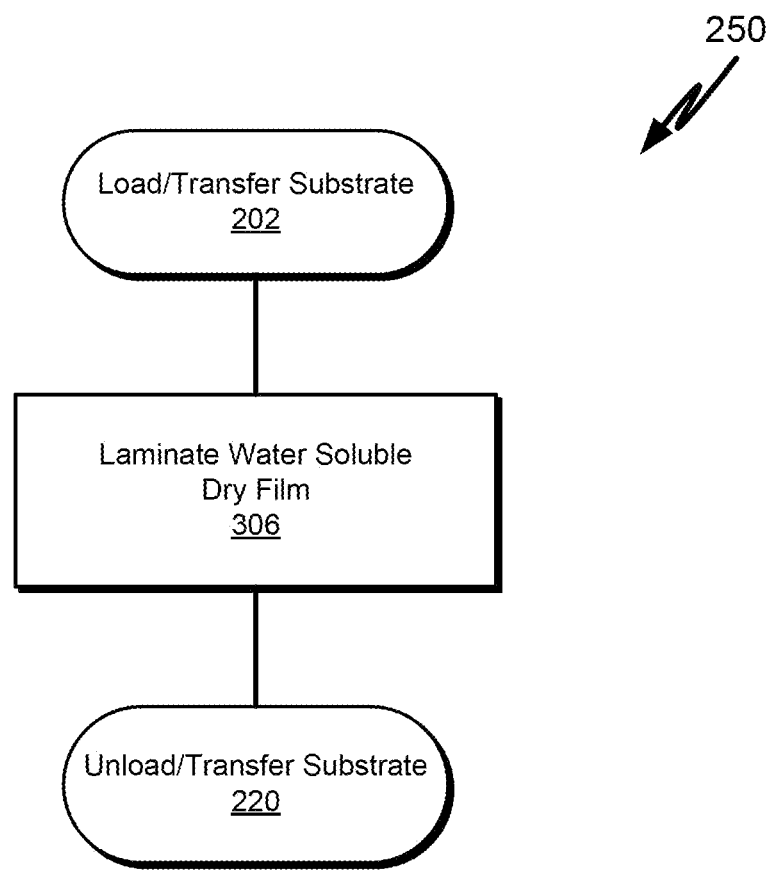
FIG. 2B is a flow diagram illustrating a dry film lamination method of applying a water soluble mask layer to a substrate to be diced, in accordance with an embodiment of the present invention.

In another embodiment, the water soluble layer 502 is applied as a dry film laminate to cover the passivation layer 511 and bump 512. FIG. 2B is a flow diagram illustrating a laminate method 250 for applying a water soluble mask layer to a substrate to be diced, in accordance with an embodiment of the present invention. Beginning at operation 202, a substrate is loaded onto a lamination system or transferred into a lamination module of an integrated platform. At operation 306, dry film lamination is performed under vacuum using techniques conventional to apparatuses for frontside taping with adjustments to accommodate the sub-30 μm $T_{max}$ film thicknesses. In particular embodiments employing a dry film with no adhesive layer, Van der Waals force or electrostatic force is relied upon to hold the dry film to the passivation layer 511 and/or bump 512. The dry film lamination operation 306 may further include a thermal process for heating of the dry water soluble film, to improve heating and/or controllably shrink or stretch the film over the passivation layer 511 and bump 512. Completing laminate method 250 at operation 220, the substrate is unloaded for laser scribe or transferred in-vaccuo to a laser scribe module. For particular embodiments where the water soluble layer 502 is hygroscopic, in-vaccuo transfer is particularly advantageous.

Depending on the embodiment, either of the spin coating method 200 or dry film laminating method 250 is to be performed prior to, or subsequent to, a backside grind (BSG). As spin coating is generally an accomplished technique for substrates having a conventional thickness of 750 μm, the spin coating method 200 may be advantageously performed prior to backside grind. However, in the alternative, the spin coating method 200 is performed subsequent to the backside grind, for example by supporting both the thin substrate and taped frame upon a rotatable chuck. As dry film laminating is generally an accomplished technique for thinned substrates, the laminating method 250 may be advantageously performed subsequent to backside grind. However, in the alternative, the laminate method 250 is performed prior to the backside grind, for example as a first layer of a frontside tape stack over which a relatively thicker conventional BSG tape is to be applied first.

Figure 3A:
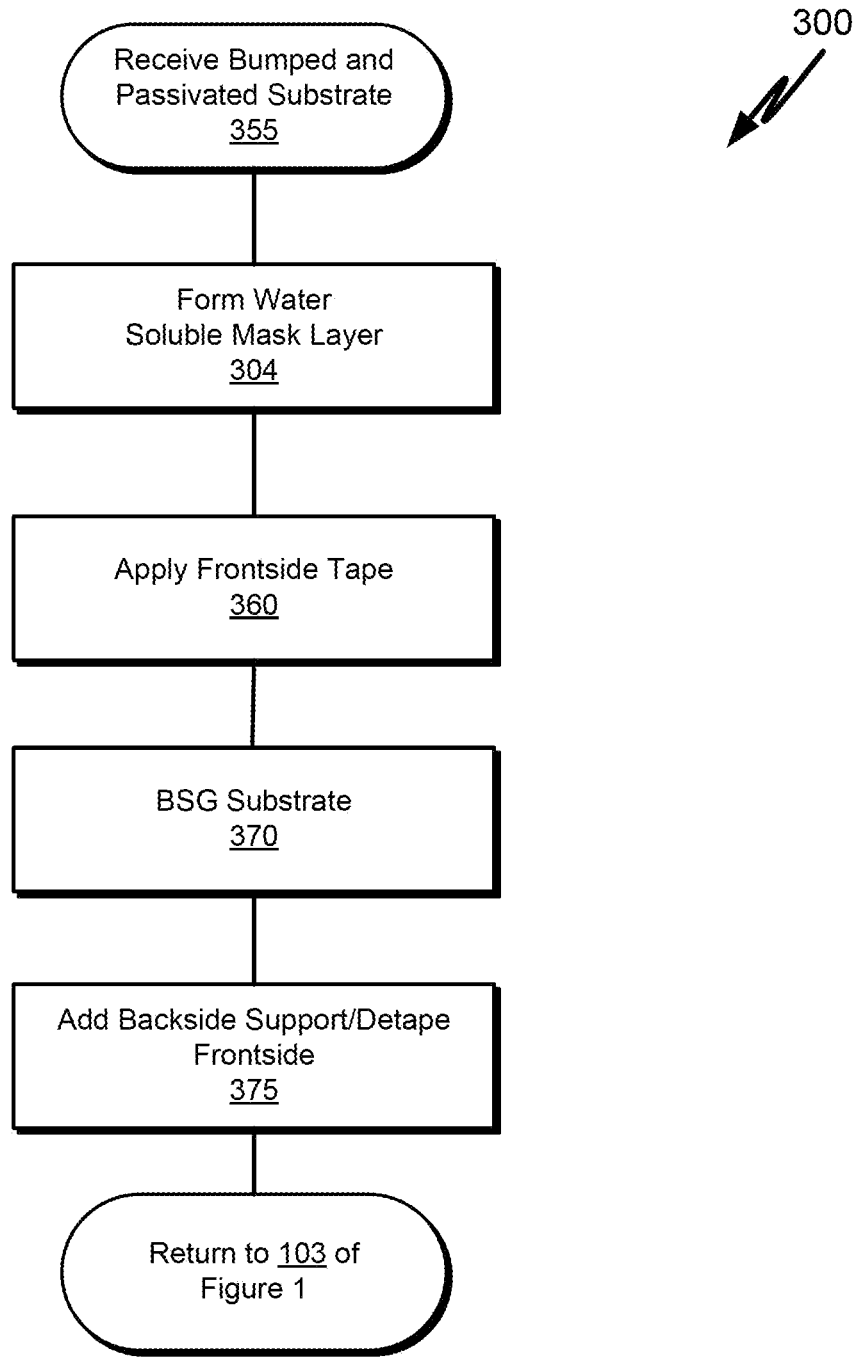
FIG. 3A is a flow diagram illustrating a method of applying a water soluble mask layer to a substrate to be diced prior to wafer thinning, in accordance with an embodiment of the present invention.

FIG. 3A is a flow diagram illustrating a method 300 for applying the mask layer 402 to a substrate to be diced prior to wafer thinning. Method 300 begins with receiving a bumped and passivated substrate at operation 355. At operation 304, the water soluble mask layer (e.g., water soluble layer 502) is formed. Operation 304 may therefore entail either wet or dry application of the water soluble mask layer, as described elsewhere herein. At operation 360, frontside tape is formed over the water soluble mask layer. Any conventional frontside tape, such as, but not limited to UV-tape, may be applied over the water soluble mask layer. At operation 370, the substrate is thinned from the backside, for example by grinding the bottom surface 501 of the substrate 406 illustrated in FIG. 5. At operation 375, a backside support 411 is added to the thinned substrate. For example, the backside tape 410 may be applied and the frontside tape then removed to expose the water soluble mask layer. Method 300 then returns to operation 103 (FIG. 1) to complete method 100, in accordance with an embodiment of the present invention.

Figure 3B:
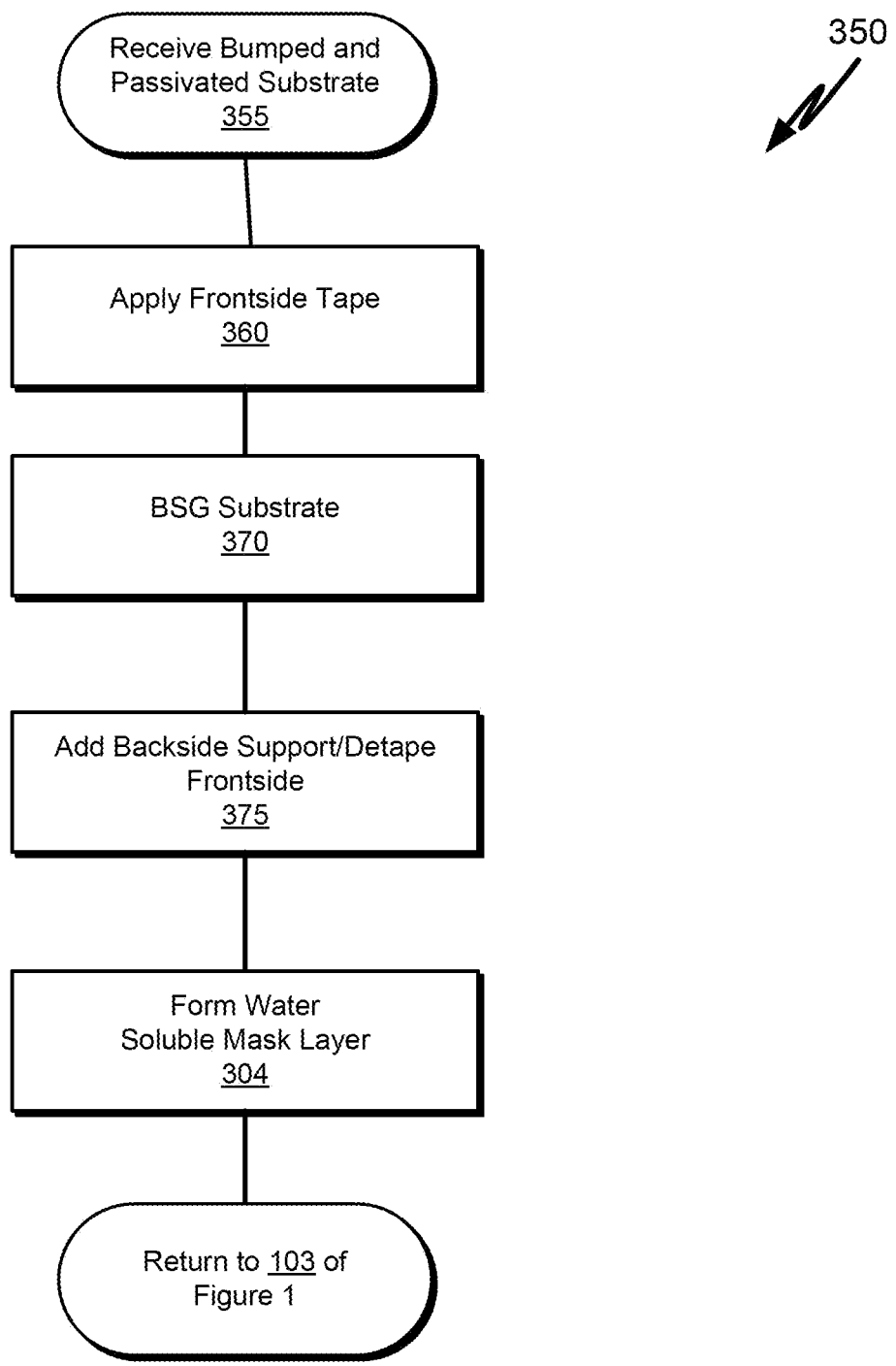
FIG. 3B is a flow diagram illustrating a method of applying a water soluble mask layer to a substrate to be diced subsequent to wafer thinning, in accordance with an embodiment of the present invention.

FIG. 3B is a flow diagram illustrating a method 350 for applying the mask layer 402 to a substrate to be diced subsequent to wafer thinning. Method 350 begins with receiving a bumped and passivated substrate at operation 355. At the operation 360, any conventional frontside tape, such as, but not limited to UV-tape is applied over the ICs. At operation 370, the substrate is thinned from the backside, for example by grinding the bottom surface 501 of the substrate 406 illustrated in FIG. 5. At operation 375, a backside support 411 is added to the thinned substrate. For example, the backside tape 410 may be applied and the frontside tape then removed from the water soluble mask layer. At operation 304, the water soluble mask layer (e.g., water soluble layer 502) is then formed. Operation 304 may again entail either wet or dry application of the water soluble mask layer, as described elsewhere herein. Method 350 then returns to operation 103 (FIG. 1) to complete method 300, in accordance with an embodiment of the present invention.

Figure 4B:
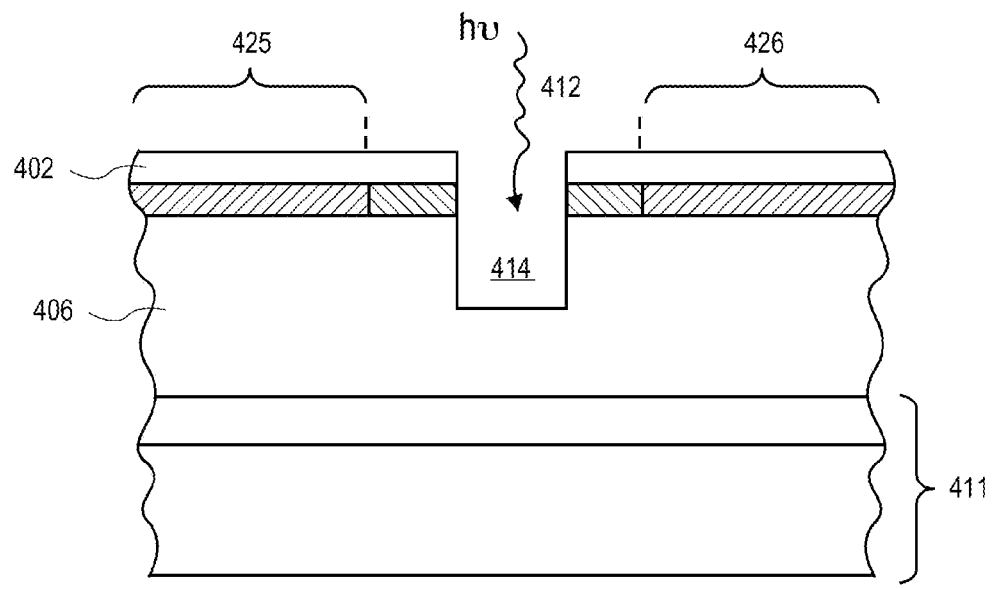
FIG. 4B illustrates a cross-sectional view of a semiconductor substrate including a plurality of ICs corresponding to operation 103 of the dicing method illustrated in FIG. 1, in accordance with an embodiment of the present invention.

Returning now to operation 103 of method 100, and corresponding FIG. 4B, the mask layer 402 is patterned by ablation with a laser scribing process forming trenches 412, extending the subsurface thin film device layers, and exposing regions of the substrate 406 between the ICs 425, 426. As such, the laser scribing process is used to ablate the thin film material of the streets 427 originally formed between the ICs 425, 426. In accordance with an embodiment of the present invention, patterning the mask layer 402 with the laser-based scribing process includes forming trenches 414 partially into the regions of the substrate 406 between the ICs 425, 426, as depicted in FIG. 4B.

In the exemplary embodiment illustrated in FIG. 5, the laser scribing depth $D_L$ is approximately in the range of 5 μms to 50 μms deep, advantageously in the range of 10 μms to 20 μms deep, depending on the thickness $T_F$ of the passivation layer 511 and subsurface thin film device layers and thickness $T_{max}$ of the water soluble layer 502 (an any additional material layer included as part of the mask 402).

In an embodiment, the mask layer 402 is patterned with a laser having a pulse width (duration) in the femtosecond range (i.e., $10^{-15}$ seconds), referred to herein as a femtosecond laser. Laser parameters selection, such as pulse width, may be critical to developing a successful laser scribing and dicing process that minimizes chipping, microcracks and delamination in order to achieve clean laser scribe cuts. A laser frequency in the femtosecond range advantageously mitigates heat damage issues relative longer pulse widths (e.g., picosecond or nanosecond). Although not bound by theory, as currently understood a femtosecond energy source avoids low energy recoupling mechanisms present for picosecond sources and provides for greater thermal nonequilibrium than does a nanosecond-source. With nanosecond or picoseconds laser sources, the various thin film device layer materials present in the street 427 behave quite differently in terms of optical absorption and ablation mechanisms. For example, dielectrics layers such as silicon dioxide, is essentially transparent to all commercially available laser wavelengths under normal conditions. By contrast, metals, organics (e.g., low-κ materials) and silicon can couple photons very easily, particularly nanosecond-based or picosecond-based laser irradiation. If non-optimal laser parameters are selected, in a stacked structures that involve two or more of an inorganic dielectric, an organic dielectric, a semiconductor, or a metal, laser irradiation of the street 427 may disadvantageously cause delamination. For example, a laser penetrating through high bandgap energy dielectrics (such as silicon dioxide with an approximately of 9 eV bandgap) without measurable absorption may be absorbed in an underlying metal or silicon layer, causing significant vaporization of the metal or silicon layers. The vaporization may generate high pressures potentially causing severe interlayer delamination and microcracking. Femtosecond-based laser irradiation processes have been demonstrated to avoid or mitigate such microcracking or delamination of such material stacks.

Parameters for a femtosecond laser-based process may be selected to have substantially the same ablation characteristics for the inorganic and organic dielectrics, metals, and semiconductors. For example, the absorptivity/absorptance of silicon dioxide is non-linear and may be brought more in-line with that of organic dielectrics, semiconductors and metals. In one embodiment, a high intensity and short pulse width femtosecond-based laser process is used to ablate a stack of thin film layers including a silicon dioxide layer and one or more of an organic dielectric, a semiconductor, or a metal. In accordance with an embodiment of the present invention, suitable femtosecond-based laser processes are characterized by a high peak intensity (irradiance) that usually leads to nonlinear interactions in various materials. In one such embodiment, the femtosecond laser sources have a pulse width approximately in the range of 10 femtoseconds to 450 femtoseconds, although preferably in the range of 50 femtoseconds to 500 femtoseconds.

In certain embodiments, the laser emission spans any combination of the visible spectrum, the ultra-violet (UV), and/or infra-red (IR) spectrums for a broad or narrow band optical emission spectrum. Even for femtosecond laser ablation, certain wavelengths may provide better performance than others. For example, in one embodiment, a femtosecond-based laser process having a wavelength closer to or in the UV range provides a cleaner ablation process than a femtosecond-based laser process having a wavelength closer to or in the IR range. In a specific embodiment, a femtosecond laser suitable for semiconductor substrate or substrate scribing is based on a laser having a wavelength of approximately less than or equal to 540 nanometers, although preferably in the range of 540 nanometers to 250 nanometers. In a particular embodiment, pulse widths are less than or equal to 500 femtoseconds for a laser having a wavelength less than or equal to 540 nanometers. However, in an alternative embodiment, dual laser wavelengths (e.g., a combination of an IR laser and a UV laser) are used.

In one embodiment, the laser and associated optical pathway provide a focal spot at the work surface approximately in the range of 3 μm to 15 μm, though advantageously in the range of 5 μm to 10 μm. The spatial beam profile at the work surface may be a single mode (Gaussian) or have a beam shaped top-hat profile. In an embodiment, the laser source has a pulse repetition rate approximately in the range of 300 kHz to 10 MHz, although preferably approximately in the range of 500 kHz to 5 MHz In an embodiment, the laser source delivers pulse energy at the work surface approximately in the range of 0.5 μJ to 100 μJ, although preferably approximately in the range of 1 μJ to 5 μJ. In an embodiment, the laser scribing process runs along a work piece surface at a speed approximately in the range of 500 mm/sec to 5 msec, although preferably approximately in the range of 600 mm/sec to 2 msec.

The scribing process may be run in single pass only, or in multiple passes, but is advantageously no more than two passes. The laser may be applied either in a train of single pulses at a given pulse repetition rate or a train of pulse bursts. In an embodiment, the kerf width of the laser beam generated is approximately in the range of 2 μms to 15 μm, although in silicon substrate scribing/dicing preferably approximately in the range of 6 μm to 10 μm, as measured at a device/silicon interface.

Figure 4C:
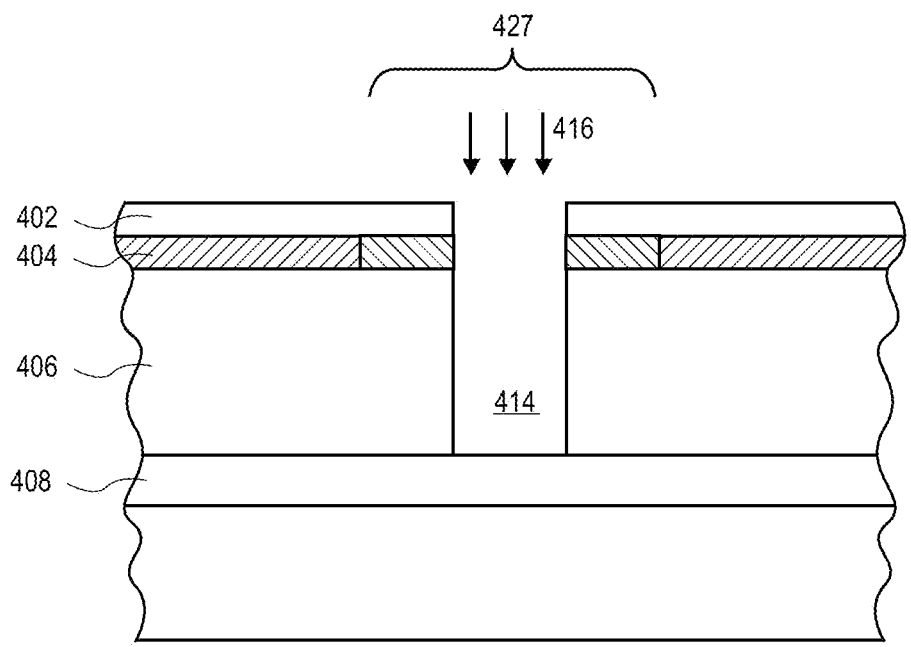
FIG. 4C illustrates a cross-sectional view of a semiconductor substrate including a plurality of ICs corresponding to operation 105 of the dicing method illustrated in FIG. 1, in accordance with an embodiment of the present invention.
Figure 4D:
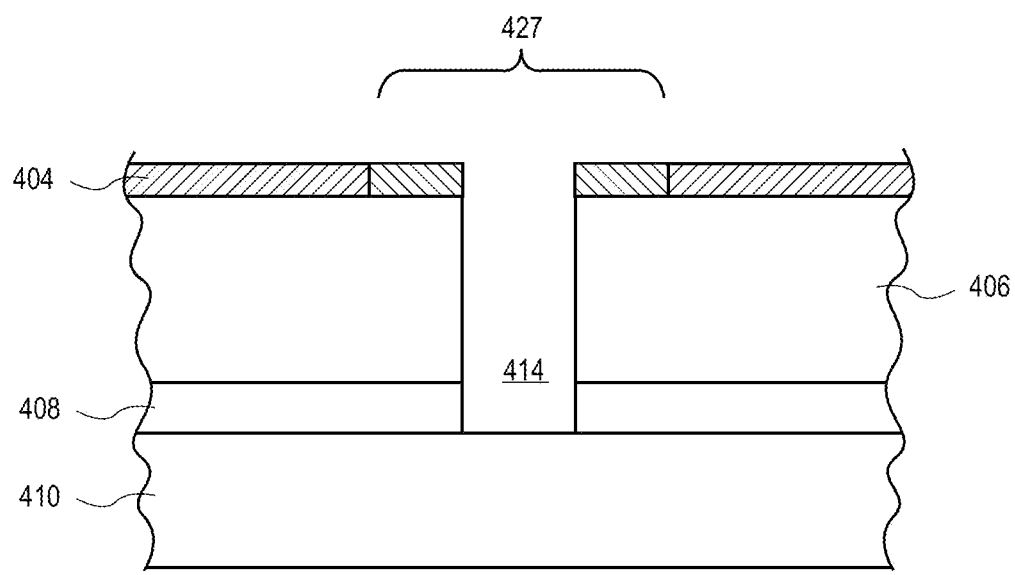
FIG. 4D illustrates a cross-sectional view of a semiconductor substrate including a plurality of ICs corresponding to operation 107 of the dicing method illustrated in FIG. 1, in accordance with an embodiment of the present invention.

Returning to FIGS. 1 and 4C, the substrate 406 is etched through the trenches 412 in the patterned mask layer 402 to singulate the ICs 426. In accordance with an embodiment of the present invention, etching the substrate 406 includes etching the trenches 412 formed with the femtosecond-based laser scribing process to ultimately etch entirely through substrate 406, as depicted in FIG. 4C.

In an embodiment, etching the substrate 406 includes using a plasma etching process. In one embodiment, a through via etch process is used. For example, in a specific embodiment, the etch rate of the material of substrate 406 is greater than 25 μms per minute. A high-density plasma source operating at high powers may be used for the plasma etching operation 105. Exemplary powers range between 3 kW and 6 kW, or more.

In an exemplary embodiment, a deep silicon etch (i.e., such as a through silicon via (TSV) etch) is used to etch a single crystalline silicon substrate or substrate 406 at an etch rate greater than approximately 40% of conventional silicon etch rates while maintaining essentially precise profile control and virtually scallop-free sidewalls. Effects of the high power on the water soluble mask are controlled through application of cooling power via an electrostatic chuck (ESC) chilled to −10° C. to −15° C. to maintain the water soluble mask layer at a temperature below 100° C. and preferably between 70° C. and 80° C. throughout the duration of the plasma etch process. At such temperatures, water solubility of the mask is advantageously maintained.

In a specific embodiment, the plasma etch entails a plurality of protective polymer deposition cycles interleaved over time with a plurality of etch cycles. The duty cycle may vary with the exemplary duty cycle being approximately 1:1. For example, the etch process may have a deposition cycle with a duration of 250 ms-750 ms and an etch cycle of 250 ms-750 ms. Between the deposition and etch cycles, an etching process chemistry, employing for example $SF_6$ for the exemplary silicon etch embodiment, is alternated with a deposition process chemistry, employing a polymerizing $C_xF_y$ gas such as, but not limited to, $C_4F_6$ or $C_4F_8$. Process pressures may further be alternated between etch and deposition cycles to favor each in the particular cycle, as known in the art.

At operation 107, method 300 is completed with removal of the mask layer 402. In an embodiment, the water soluble mask is washed off with water, for example with a pressurized jet of de-ionized water or submergence in an ambient or heated water bath. In alternative embodiments, the mask layer 402 may be washed off with aqueous solvent solutions known in the art having removal rates enhanced by a pH below that of de-ionized water. As further illustrated in FIG. 4D, either of the plasma singulation process or mask removal process may further pattern the die attach film 908, exposing the top portion of the backing tape 910.

Figure 6:
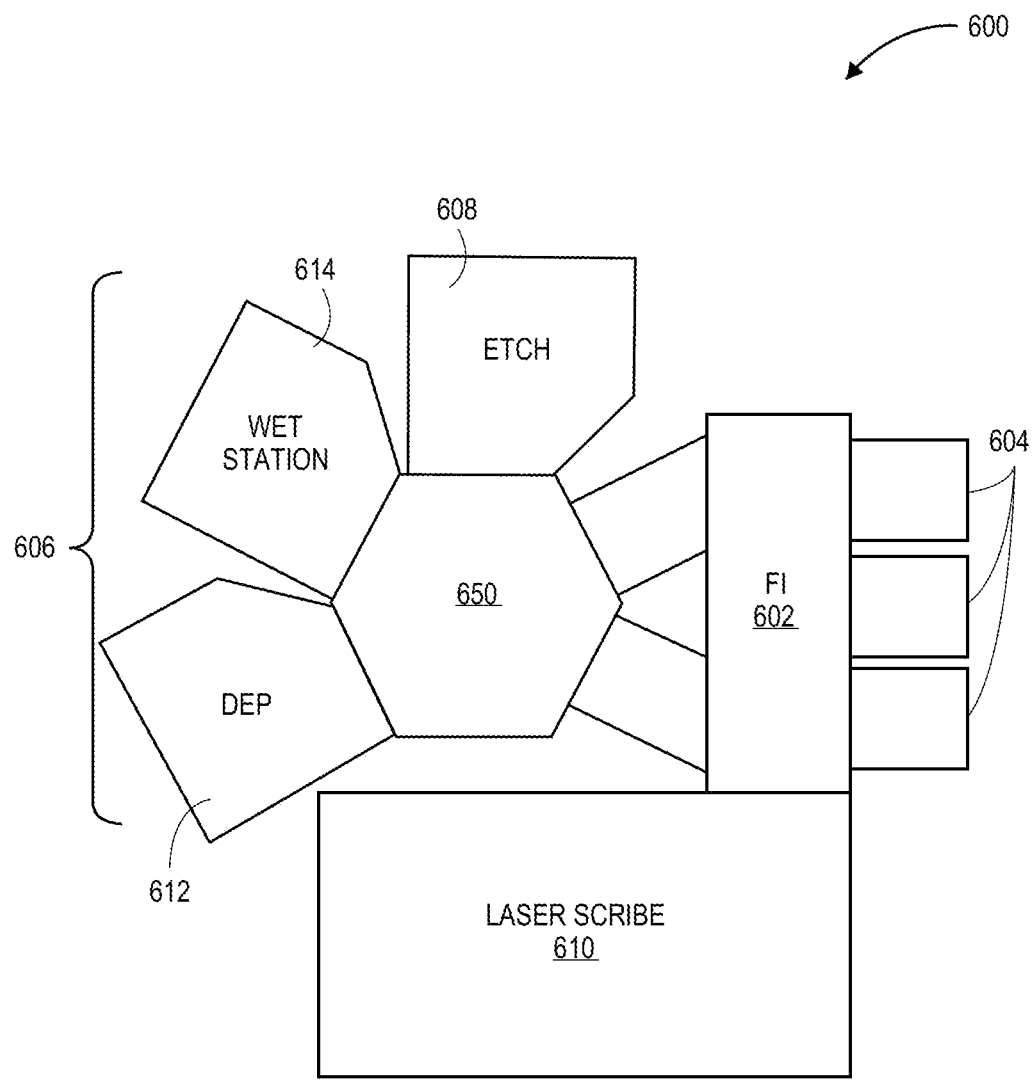
FIG. 6 illustrates a block diagram of a tool layout for laser and plasma dicing of substrates with an integrated wet station for mask removal, in accordance with an embodiment of the present invention.

A single process tool 600 may be configured to perform many or all of the operations in the hybrid laser ablation-plasma etch singulation process 100. For example, FIG. 6 illustrates a block diagram of a cluster tool 606 coupled with laser scribe apparatus 610 for laser and plasma dicing of substrates, in accordance with an embodiment of the present invention. Referring to FIG. 6, the cluster tool 606 is coupled to a factory interface 602 (FI) having a plurality of load locks 604. The factory interface 602 may be a suitable atmospheric port to interface between an outside manufacturing facility with laser scribe apparatus 610 and cluster tool 606. The factory interface 602 may include robots with arms or blades for transferring substrates (or carriers thereof) from storage units (such as front opening unified pods) into either cluster tool 606 or laser scribe apparatus 610, or both.

A laser scribe apparatus 610 is also coupled to the FI 602. In an embodiment, the laser scribe apparatus 610 includes a femtosecond laser. The femtosecond laser to performing the laser ablation portion of the hybrid laser and etch singulation process 100. In one embodiment, a moveable stage is also included in laser scribe apparatus 610, the moveable stage configured for moving a substrate or substrate (or a carrier thereof) relative to the femtosecond-based laser. In a specific embodiment, the femtosecond laser is also moveable.

The cluster tool 606 includes one or more plasma etch chambers 608 coupled to the FI by a robotic transfer chamber 650 housing a robotic arm for in-vaccuo transfer of substrates. The plasma etch chambers 608 is suitable for performing a plasma etch portion of the hybrid laser and etch singulation process 100. In one exemplary embodiment, the plasma etch chamber 608 is further coupled to an $SF_6$ gas source and at least one of a $C_4F_8$ and $C_4F_6$ source. In a specific embodiment, the one or more plasma etch chambers 608 is an Applied Centura® Silvia™ Etch system, available from Applied Materials of Sunnyvale, Calif., USA, although other suitable etch systems are also available commercially. In an embodiment, more than one plasma etch chamber 608 is included in the cluster tool 606 portion of integrated platform 600 to enable high manufacturing throughput of the singulation or dicing process.

The cluster tool 606 may include other chambers suitable for performing functions in the hybrid laser ablation-plasma etch singulation process 100. In the exemplary embodiment illustrated in FIG. 6, a wet process module 614 is coupled to the robotic transfer module 650 to wash off a remainder of a water soluble mask after plasma etching the substrate. The wet process module 614 may include for example a pressurized water spray jet or other solvent dispenser.

In still other embodiments, the deposition module 612 may be either of a spin coating module or a lamination module for application of the water soluble mask layer described herein. As a spin coating module, the deposition module 612 may include a rotatable chuck adapted to clamp by vacuum, or otherwise, a thinned substrate mounted on a carrier such as backing tape mounted on a frame. As a lamination module, the deposition module 612 may include a tape reel and wafer taping mechanism, as known in the art.

Figure 7:
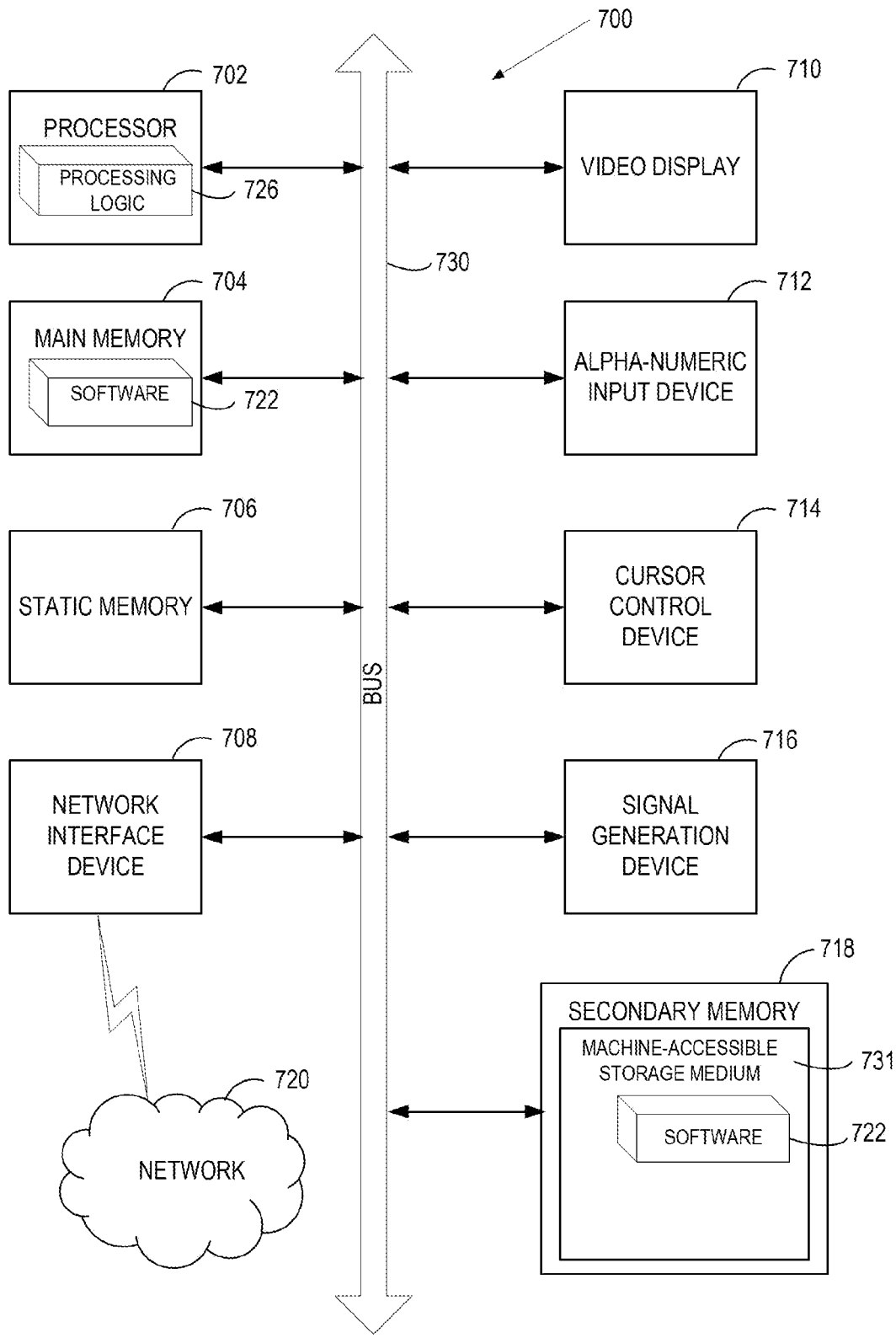
FIG. 7 illustrates a block diagram of an exemplary computer system which controls automated performance of one or more operation in the masking, laser scribing, plasma dicing methods described herein, in accordance with an embodiment of the present invention.

FIG. 7 illustrates a computer system 700 within which a set of instructions, for causing the machine to execute one or more of the scribing methods discussed herein may be executed, for example to analyze a reflected light from a tag to identify at least one micromachine artifact. The exemplary computer system 700 includes a processor 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a secondary memory 718 (e.g., a data storage device), which communicate with each other via a bus 730.

Processor 702 represents one or more general-purpose processing devices such as a microprocessor, central processing unit, or the like. More particularly, the processor 702 may be a complex instruction set computing (CISC) microprocessor, reduced instruction set computing (RISC) microprocessor, very long instruction word (VLIW) microprocessor, etc. Processor 702 may also be one or more special-purpose processing devices such as an application specific integrated circuit (ASIC), a field programmable gate array (FPGA), a digital signal processor (DSP), network processor, or the like. Processor 702 is configured to execute the processing logic 726 for performing the operations and steps discussed herein.

The computer system 700 may further include a network interface device 708. The computer system 700 also may include a video display unit 710 (e.g., a liquid crystal display (LCD) or a cathode ray tube (CRT)), an alphanumeric input device 712 (e.g., a keyboard), a cursor control device 714 (e.g., a mouse), and a signal generation device 716 (e.g., a speaker).

The secondary memory 718 may include a machine-accessible storage medium (or more specifically a computer-readable storage medium) 731 on which is stored one or more sets of instructions (e.g., software 722) embodying any one or more of the methodologies or functions described herein. The software 722 may also reside, completely or at least partially, within the main memory 704 and/or within the processor 702 during execution thereof by the computer system 700, the main memory 704 and the processor 702 also constituting machine-readable storage media. The software 722 may further be transmitted or received over a network 720 via the network interface device 708.

The machine-accessible storage medium 731 may also be used to store pattern recognition algorithms, artifact shape data, artifact positional data, or particle sparkle data. While the machine-accessible storage medium 731 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

Thus, methods of dicing semiconductor substrates, each substrate having a plurality of ICs, have been disclosed. The above description of illustrative embodiments of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize. The scope of the invention is therefore to be determined entirely by the following claims, which are to be construed in accordance with established doctrines of claim interpretation.

What is claimed is:

1. A method of dicing a substrate comprising a plurality of ICs, the method comprising:
    forming a mask over the substrate covering and protecting the ICs, the mask comprising a layer of water soluble material in contact with a top surface of the ICs;
    patterning the mask and a portion of the substrate with a laser scribing process to provide a patterned mask and substrate with gaps, exposing regions of the substrate between the ICs, wherein each gap has a width in the substrate; and
    plasma etching through the gaps to form trenches in the substrate and to singulate the ICs, wherein each trench has the width.

2. The method of claim 1, wherein patterning the mask with the laser scribing process comprises forming the gaps with a femtosecond laser, and wherein the water soluble material comprises a water soluble polymer, and wherein etching the semiconductor substrate comprises etching to form the trenches with a deep trench etch process during which the water soluble material is maintained below 100° C.

3. The method of claim 2, wherein patterning the mask with the femtosecond laser scribing process comprises using a laser having a wavelength less than or equal to 530 nanometers and a laser pulse width less than or equal to 500 femtoseconds.

4. The method of claim 1, wherein forming the mask further comprises forming the water soluble material layer to a thickness of no more than 20 microns over a street between the ICs and at least 10 μm over a top bump surface of an IC.

5. The method of claim 1, wherein the forming the mask comprises applying at least one of: poly(vinyl alcohol), poly(acrylic acid), poly(methacrylic acid), poly(acrylamide), or poly(ethylene oxide) in contact with the top surface of the IC.

6. The method of claim 5, wherein forming the mask comprises applying poly(vinyl alcohol) in contact with the top surface of the IC.

7. The method of claim 1, wherein the applying comprises:
spin coating an aqueous solution of a water soluble polymer on to the top surface of the IC; and
drying the aqueous solution.

8. The method of claim 7, further comprising thinning the substrate with a backside grind process, wherein the spin coating is performed after the backside grind.

9. The method of claim 1, wherein the applying comprises: vacuum laminating a dry film of the water soluble material on to the top surface of the IC.

10. The method of claim 1, further comprising thinning the substrate with a backside grind process, wherein the vacuum laminating is performed after the backside grind.

11. The method of claim 1, further comprising removing the water soluble mask after plasma etching the substrate with an aqueous solution.

12. The method of claim 11, wherein the removing comprises rinsing off the water soluble mask with a pressurized jet of water.

13. A method of dicing a semiconductor substrate comprising a plurality of ICs, the method comprising:
forming a water soluble mask over a silicon substrate, the water soluble mask covering and protecting ICs disposed on the silicon substrate, the ICs comprising a thin film stack including a layer of silicon dioxide, a layer of low-k material and a layer of copper;
patterning the water soluble mask, the layer of low-k material, the layer of copper, and a portion of the silicon substrate with a femtosecond laser to create gaps therein and to expose regions of the silicon substrate between the ICs, wherein each gap has a width in the silicon substrate; and
plasma etching the silicon substrate through the gaps to form trenches in the silicon substrate and to singulate the ICs, wherein each trench has the width in the silicon substrate.

14. The method of claim 13, wherein patterning the layer of silicon dioxide, the layer of low-k material, and the layer of copper with the femtosecond laser comprises ablating the layer of silicon dioxide prior to ablating the layer of low-k material and the layer of copper and wherein etching the silicon substrate comprises exposing the substrate to a plasma of $SF_6$ and at least one of $C_4F_8$ and $C_4F_6$ while maintaining the water soluble material layer at a temperature below 100° C.

* * * * *

UNITED STATES PATENT AND TRADEMARK OFFICE
CERTIFICATE OF CORRECTION

PATENT NO. : 8,703,581 B2
APPLICATION NO. : 13/160891
DATED : April 22, 2014
INVENTOR(S) : Lei et al.

It is certified that error appears in the above-identified patent and that said Letters Patent is hereby corrected as shown below:

On the Title Page

Abstract, item (57), line 1, replace "plurality of ICs" with "plurality of ICs are disclosed"

Abstract, item (57), line 8, replace "material layer washed" with "material layer is washed"

In the Specification

Column 1, lines 8-9, replace "having an IC (IC)" with "having an integrated circuit (IC)"

Column 2, line 19, replace "PVA layer then" with "PVA layer is then"

Column 2, line 30, replace "coating water soluble mask layer" with "coating a wafer soluble mask layer"

Column 2, line 61, replace "mask applied to over" with "mask applied over"

Column 3, line 41, replace ""coupled" my be used" with ""coupled" may be used"

Column 3, line 46, replace "cause an effect" with "cause and effect"

Column 4, line 8, replace "scribing is an essentially" with "scribing is essentially"

Column 4, lines 8-9, replace "completely, non-equilibrium" with "completely, a non-equilibrium"

Column 4, line 12, replace "to singulated ICs" with "to singulate ICs"

Signed and Sealed this
Thirtieth Day of September, 2014

Michelle K. Lee
*Deputy Director of the United States Patent and Trademark Office*

CERTIFICATE OF CORRECTION (continued)

U.S. Pat. No. 8,703,581 B2

Column 4, line 42, replace "(not illustrate)" with "(not illustrated)"

Column 4, line 62, replace "protection a top surface" with "protection of a top surface"

Column 5, line 58, replace "426 and or edges" with "426 and/or edges"

Column 6, lines 26-27, replace "may offer similar a etch" with "may offer a similar etch"

Column 6, line 47, replace "50 μm bumps a" with "50 μm bumps, a"

Column 6, line 48, replace "5 μm and" with "5 μm, and"

Column 6, line 50, replace "substrate unloaded" with "substrate is unloaded"

Column 7, line 51, replace "tape then removed" with "tape may then be removed"

Column 7, line 65, replace "tape then removed" with "tape may then be removed"

Column 8, line 9, replace "extending the subsurface" with "extending to the subsurface"

Column 8, line 33, replace "relative longer" with "relative to longer"

Column 8, line 42, replace "dielectrics layers" with "dielectric layers"

Column 8, line 46, replace "particularly nanosecond-based" with "particularly in nanosecond-based"

Column 8, lines 47-48, replace "selected, in a stacked structures" with "selected for stacked structures"

Column 8, line 53, replace "with an approximately of 9 eV" with "with approximately 9 eV"

Column 10, line 58, replace "laser to performing" with "laser performs"

Column 10, line 63, replace "a substrate or substrate" with "a substrate"

Column 11, line 7, replace "Silvi$^a$™" with "Silvia™"

In the Claims

Column 12, lines 55-56, replace "wherein etching the semiconductor substrate" with "wherein plasma etching the substrate"

Column 12, line 60, replace "the femtosecond laser" with "the laser"